(12) United States Patent
Park et al.

(10) Patent No.: US 10,657,852 B2
(45) Date of Patent: May 19, 2020

(54) FLEXIBLE TRANSPARENT DISPLAY SHEET, AND IMAGE DISPLAY APPARATUS INCLUDING THE SAME

(71) Applicant: LG ELECTRONICS INC., Seoul (KR)

(72) Inventors: Jungwoon Park, Seoul (KR); Jeoungan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/537,446

(22) Filed: Aug. 9, 2019

(65) Prior Publication Data
US 2020/0051469 A1 Feb. 13, 2020

(30) Foreign Application Priority Data

Aug. 10, 2018 (KR) .................. 10-2018-0093691

(51) Int. Cl.
*G09F 9/30* (2006.01)
*G09G 3/32* (2016.01)
(Continued)

(52) U.S. Cl.
CPC ............ *G09F 9/301* (2013.01); *G02F 1/1676* (2019.01); *G02F 1/16756* (2019.01); *G09G 1/005* (2013.01); *G09G 3/32* (2013.01)

(58) Field of Classification Search
CPC .......... G09F 9/301; G09G 3/32; G09G 1/005; G02F 1/1676; G02F 1/16756
See application file for complete search history.

(56) References Cited

U.S. PATENT DOCUMENTS

2008/0174016 A1* 7/2008 Sato ..................... H05K 1/0346
257/741
2017/0227816 A1* 8/2017 Jansen .............. G02F 1/133603
(Continued)

FOREIGN PATENT DOCUMENTS

JP      2017212442      11/2017
KP    1020170015673      2/2017
(Continued)

OTHER PUBLICATIONS

Korean Intellectual Property Office Application No. 10-2018-0093691, Office Action dated Nov. 27, 2019, 6 pages.
(Continued)

*Primary Examiner* — Joseph L Williams
(74) *Attorney, Agent, or Firm* — Lee, Hong, Degerman, Kang & Waimey

(57) ABSTRACT

The present invention relates to a flexible transparent display sheet, and an image display apparatus including the same. The flexible transparent display sheet according to an embodiment of the present disclosure includes: a base disposed in a display area and a connection area; a metal layer formed on the base; an anti-oxide layer formed on a portion of the metal layer; a plurality of solders formed on a portion of the anti-oxide layer; a plurality of light emitters, each of which is connected to each of the plurality of solders; and an insulation layer disposed in the connection area and formed on the anti-oxide layer. Accordingly, a flexible transparent display sheet having an integrally formed power connector may be provided.

20 Claims, 13 Drawing Sheets

(51) Int. Cl.
  *G02F 1/1676*   (2019.01)
  *G09G 1/00*    (2006.01)
  *G02F 1/16756*  (2019.01)

(56)      References Cited

U.S. PATENT DOCUMENTS

2017/0273188 A1*  9/2017  Su .......................... B32B 15/04
2017/0290184 A1* 10/2017  Kim ........................ H05K 1/11
2017/0338107 A1  11/2017  Yamazaki et al.

FOREIGN PATENT DOCUMENTS

KR    1020170139924    12/2017
KR    1020180010370    1/2018
KR    1020180015326    2/2018

OTHER PUBLICATIONS

PCT International Application No. PCT/KR2019/010079, International Search Report dated Dec. 6, 2019, 3 pages.

* cited by examiner

FLEXIBLE TRANSPARENT DISPLAY SHEET, AND IMAGE DISPLAY APPARATUS INCLUDING THE SAME

CROSS-REFERENCE TO RELATED APPLICATION

Pursuant to 35 U.S.C. § 119(a), this application claims the benefit of earlier filing date and right of priority to Korean Patent Application No. 10-2018-0093691, filed on Aug. 10, 2018, the contents of which are all hereby incorporated by reference herein in its entirety.

BACKGROUND OF THE INVENTION

1. Field of the Invention

The present disclosure relates generally to a flexible transparent display sheet and an image display apparatus including the same, and more particularly to a flexible transparent display sheet, having an integrally formed power connector, and an image display apparatus including the same.

2. Description of the Related Art

Research on a flexible transparent display sheet using a micro LED has been conducted to provide a flexible image display apparatus.

A general flexible transparent display sheet, having a display area and a connection area, requires a bonding process for connection between a metal layer, formed in the connection area, and a flexible printed circuit board (FPCB).

However, even after such bonding process is performed, there is a frequent risk of connection failure between the metal layer and the FPCB, and damage of the FPCB.

In addition, the image display apparatus using a plurality of flexible transparent display sheets requires a plurality of bonding processes for connection between the metal layer, formed in the connection area, and the FPCB.

SUMMARY OF THE INVENTION

It is an object of the present invention to provide a flexible transparent display sheet, having an integrally formed power connector, and an image display apparatus including the same.

It is another object of the present invention to provide a flexible transparent display sheet, in which a bonding process of a flexible printed circuit board (FPCB) may be omitted, and an image display apparatus including the same.

In accordance with an aspect of the present invention, the above objects can be accomplished by providing a flexible transparent display sheet and an image display apparatus including the same, the flexible transparent display sheet including: a base disposed in the display area and the connection area; a metal layer formed on the base; an anti-oxide layer formed on a portion of the metal layer; a plurality of solders formed on a portion of the anti-oxide layer; a plurality of light emitters, each of which is connected to each of the plurality of solders; and an insulation layer disposed in the connection area and formed on the anti-oxide layer.

The anti-oxide layer may be disposed in the display area and a first region of the connection area; and the insulation layer may be disposed in the first region of the connection area.

The flexible transparent display sheet may further include a second metal layer disposed in the connection area and formed on the metal layer.

A height of the second metal layer may be equal to a sum of a height of the anti-oxide layer and a height of the insulation layer.

The anti-oxide layer may be disposed in the display area and the first region of the connection area; and the second metal layer may be disposed in a second region adjacent to the first region of the connection area.

A width of the first region is greater than a width of the second region.

The plurality of solders, formed on a portion of the anti-oxide layer, may be electrically connected to the metal layer through an opening of the anti-oxide layer.

The flexible transparent display sheet may further include an adhesive layer disposed on the periphery of the light emitters, and formed on another portion of the anti-oxide layer.

A width of the adhesive layer, which is disposed between the light emitters, is greater than a width of the adhesive layer which is disposed on a border between the display area and the connection area.

A height of the adhesive layer may be greater than a sum of a height of the solder and a height of the light emitter.

A height of the second metal layer may be smaller than a height of the base and may be greater than a height of the metal layer.

The light emitters may include a micro light emitting diode (LED).

In accordance with another aspect of the present invention, the above objects can be accomplished by providing a flexible transparent display sheet and an image display apparatus including the same, the flexible transparent display sheet including: a base disposed in the display area and the connection area; a metal layer formed on the base; an anti-oxide layer formed on a portion of the metal layer; a plurality of solders formed on a portion of the anti-oxide layer; a plurality of light emitters, each of which is connected to each of the plurality of solders; an insulation layer disposed in a first area of the connection area and formed on the anti-oxide layer; and a second metal layer, which is disposed in a second area adjacent to the first area of the connection area, and is formed on the metal layer.

BRIEF DESCRIPTION OF THE DRAWINGS

The embodiments will be described in detail with reference to the following drawings in which like reference numerals refer to like elements wherein.

DETAILED DESCRIPTION OF THE PREFERRED EMBODIMENTS

Hereinafter, embodiments of the present disclosure will be described in further detail with reference to the accompanying drawings.

In the following description, the terms "module" and "unit", which are used herein to signify components, are merely intended to facilitate explanation of the present disclosure, and the terms do not have any distinguishable difference in meaning or role. Thus, the terms "module" and "unit" may be used interchangeably.

Figure 1:
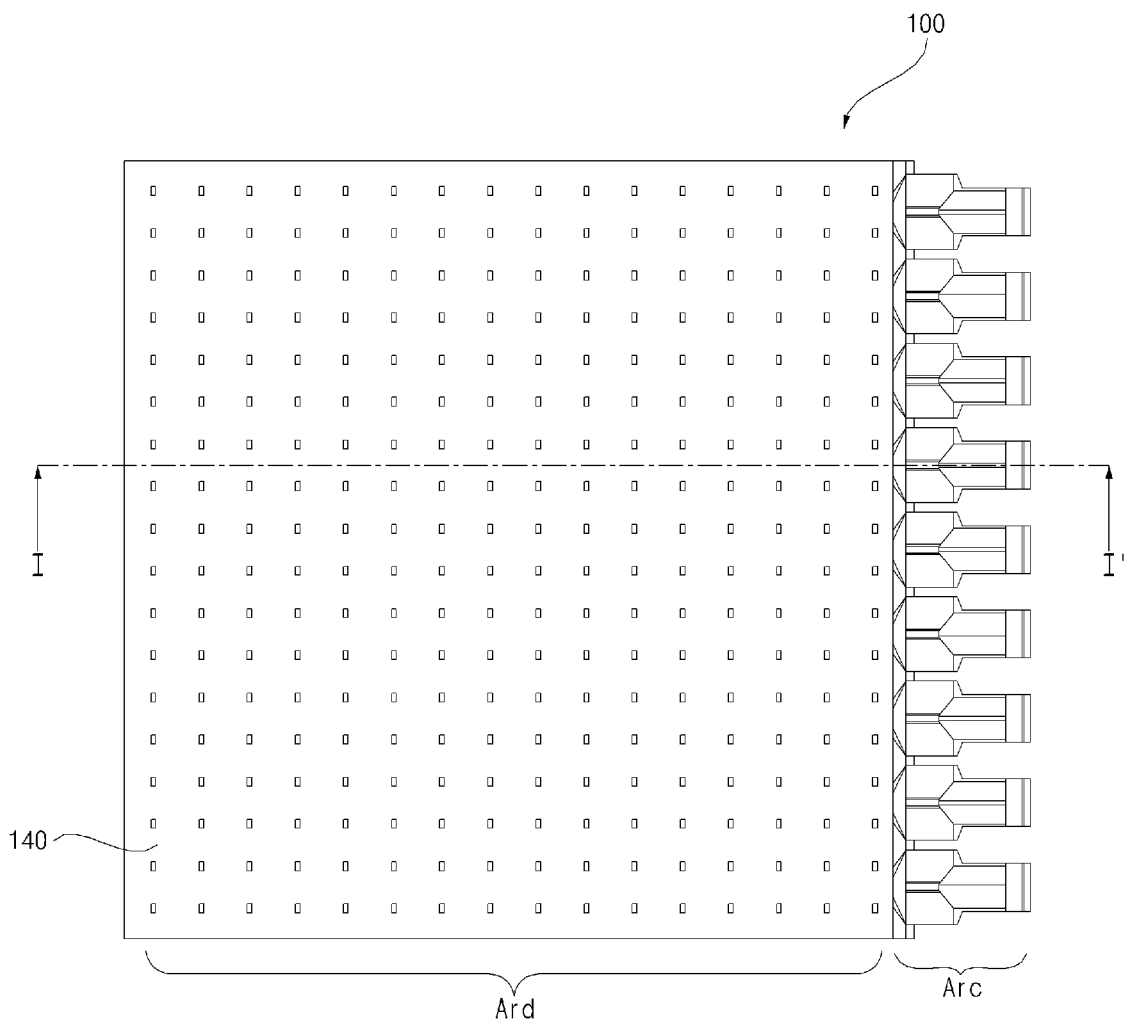
FIG. 1 is a diagram illustrating an outer appearance of a general flexible transparent display sheet.
Figure 1:
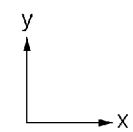
Figure 2:
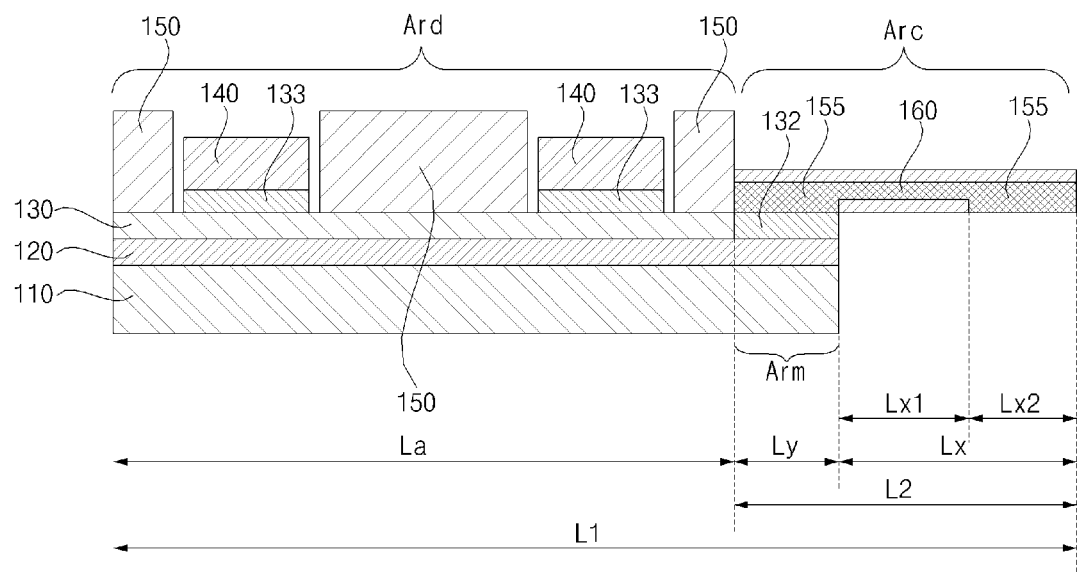
FIG. 2 is a cross-sectional diagram as taken along line I-I' of FIG. 1.

FIG. 1 is a diagram illustrating an outer appearance of a general flexible transparent display sheet; and FIG. 2 is a cross-sectional diagram as taken along line I-I' of FIG. 1.

Referring to FIG. 1, the general flexible transparent display sheet 100 includes a display area Ard in which a plurality of light emitters 140 are formed, and a connection area Arc which is used for connection to a power cable and in which no light emitters 140 are disposed.

FIG. 2 illustrates a cross-sectional view of the flexible transparent display sheet 100 of FIG. 1.

Referring to FIG. 2, the flexible transparent display sheet 100 includes a base 110, a metal layer 120 formed on the base 110, an anti-oxide layer 130 formed on a portion of the metal layer 120, a plurality of solders 133 formed on a portion of the anti-oxide layer 130, and the plurality of light emitters 140 each being connected to the plurality of solders 133.

The anti-oxide layer 130 may include anti-oxide film.

Further, the flexible transparent display sheet 100 further includes a solder 155 which is disposed in the connection area Arc and is formed on the metal layer 120, and a flexible printed circuit board (FPCB) 160 which is electrically connected to the solder 155.

In this case, a bonding process is required for electrical connection between the solder 155 and the FPCB 160. However, even after such bonding process is performed, there may be a high possibility of connection failure between the solder 155 and the FPCB 160.

Further, no separate member is provided for the bottom of the FPCB 160, which increases a possibility of damage of the FPCB 160 or the solder 155.

In order to solve the above problems, the present disclosure provides a flexible transparent display sheet having an integrally formed power connector without the FPCB 160.

According to the present disclosure, no FPCB 160 is provided, such that there is no need for a separate bonding process, and a possibility of damage of a power connector is significantly reduced, which will be described below in detail with reference to FIG. 3 and the following figures.

Figure 3:
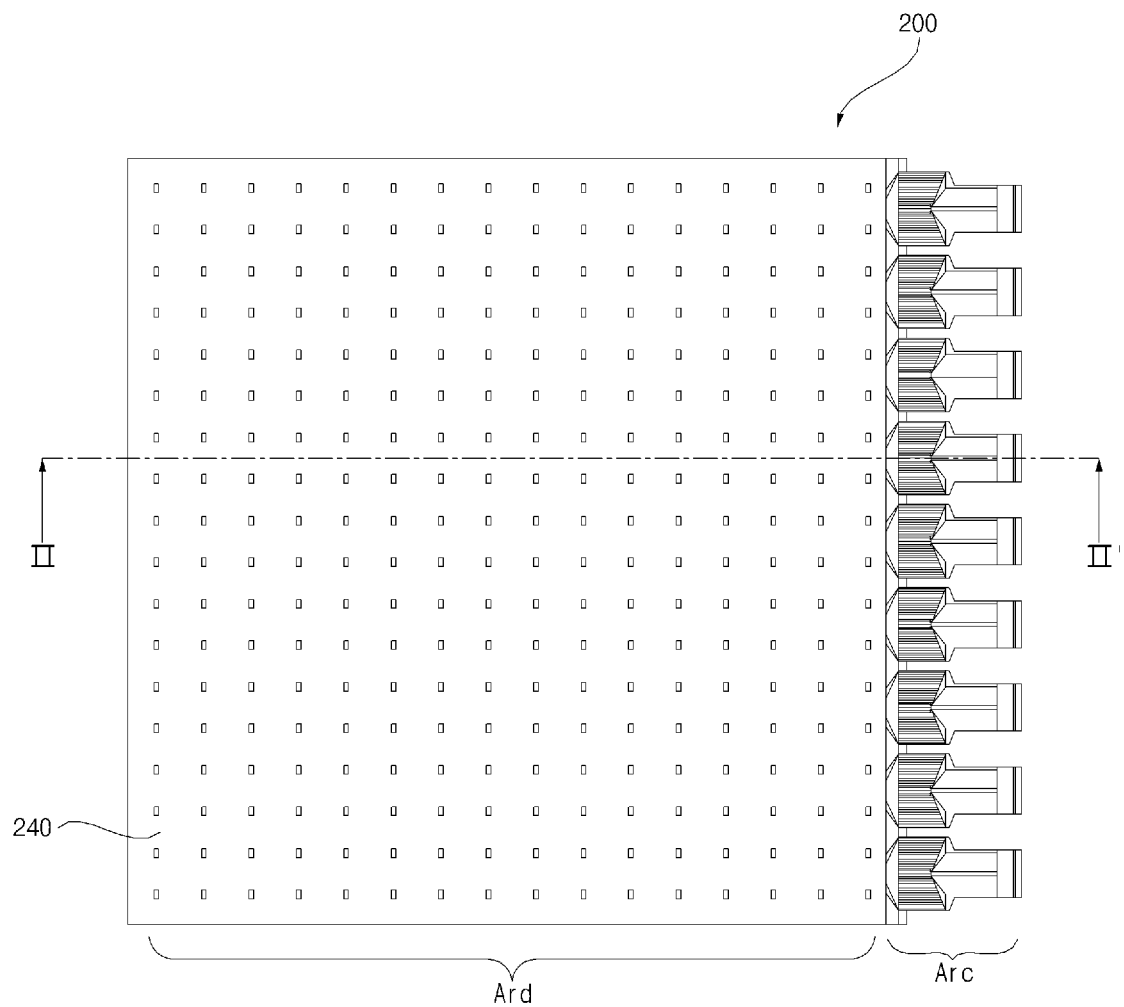
FIG. 3 is a diagram illustrating an outer appearance of a flexible transparent display sheet according to an embodiment of the present disclosure.
Figure 4:
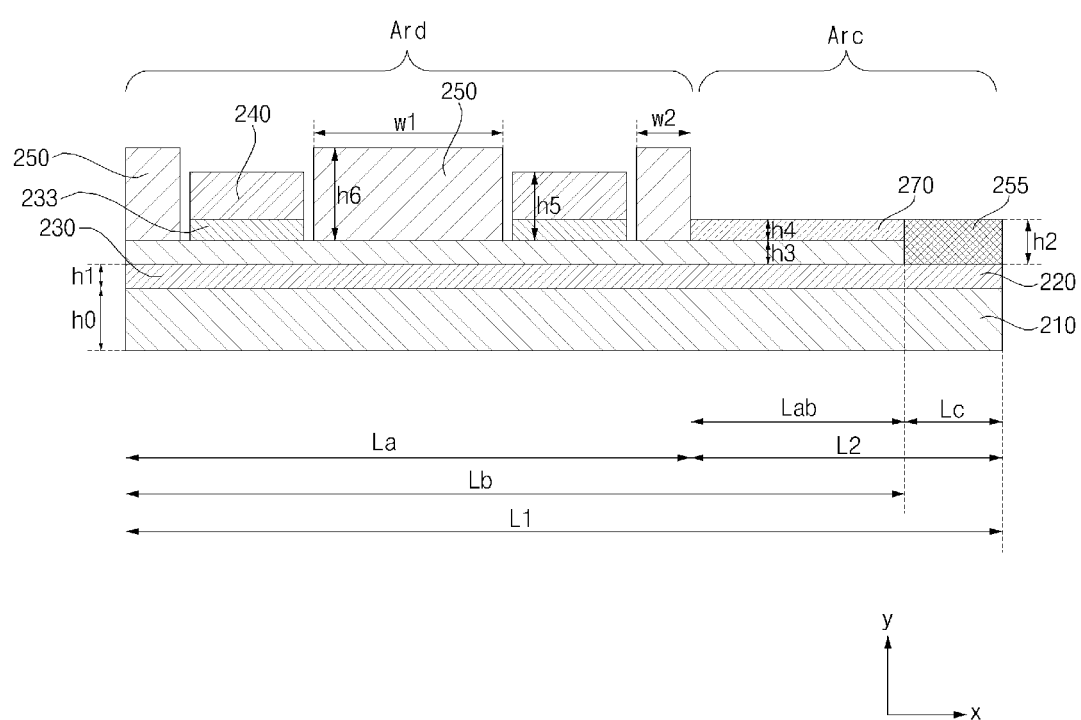
FIG. 4 is a cross-sectional diagram as taken along line II-II' of FIG. 3.

FIG. 3 is a diagram illustrating an outer appearance of a flexible transparent display sheet according to an embodiment of the present disclosure; and FIG. 4 is a cross-sectional diagram as taken along line II-II' of FIG. 3.

Referring to FIG. 3, the flexible transparent display sheet 200 includes a display area Ard in which a plurality of light emitters 240 are arranged in a grid pattern, and a connection area Arc in which a power cable is integrally formed and no light emitters 140 are disposed.

FIG. 4 illustrates a cross-sectional view of the flexible transparent display sheet 200 of FIG. 3.

Referring to FIG. 4, the flexible transparent display sheet 200 includes a base 210 disposed in the display area Ard and the connection area Arc, a metal layer 220 formed on the base 210, an anti-oxide layer 230 formed on a portion of the metal layer 220, a plurality of solders 233 formed on a portion of the anti-oxide layer 230, and a plurality of light emitters 240 each being connected to the plurality of solders 233, and an insulation layer 270 which is disposed in the connection area Arc and is formed on the anti-oxide layer 230.

The insulation layer 270 may include the insulation film.

As the insulation layer 270 is disposed only on a portion of the connection area Arc, the anti-oxide layer 230 or the metal layer 220 may be exposed to the outside. Accordingly, an external connection terminal may be directly connected to the metal layer 220 through an opening formed at the anti-oxide layer 230.

In this case, the insulation layer 270 disposed only on a portion Lab of the connection area Arc, and the anti-oxide layer 230 and the metal layer 220, which are disposed in the connection area Arc, may be referred to as a power connector.

In this manner, the flexible transparent display sheet 200 having an integrally formed power connector may be provided.

In this structure, the FPCB illustrated in FIG. 1 is omitted, such that the bonding process of the FPCB may also be omitted, thereby significantly reducing the possibility of damage of the connection area Arc.

The flexible transparent display sheet 200 according to an embodiment of the present disclosure may further include a second metal layer 255 which is disposed in the connection area Arc, and is formed on the metal layer 220.

As the insulation layer 270 is disposed in the first region Lab of the connection area Arc, the second metal layer 255 is disposed in a second region Lc, which is adjacent to the first region Lab of the connection area Arc, and is formed on the metal layer 220.

The second metal layer 255 may be electrically connected to the metal layer 220 through an opening formed at the anti-oxide layer 230.

In this case, the insulation layer 270 disposed only on the portion Lab of the connection area Arc, the anti-oxide layer 230 and the metal layer 220, which are disposed in the connection area Arc, and the second metal layer 255 may be referred to as a power connector.

In this manner, the flexible transparent display sheet 200 having an integrally formed power connector may be provided.

In this structure, the FPCB illustrated in FIG. 1 is omitted, such that the bonding process of the FPCB may also be omitted, thereby significantly reducing the possibility of damage of the connection area Arc.

It is desired that a height h2 of the second metal layer 255 is equal to a sum (h3+h4) of a height h3 of the anti-oxide layer 230 and a height h4 of the insulation layer 270, which significantly reduces the possibility of damage of the second metal layer 255, and facilitates connection to an external connector.

Further, the anti-oxide layer 230 and the insulation layer 270 may be integrally formed with the second metal layer 255, such that the flexible transparent display sheet 200 having the integrally formed power connector may be provided.

The anti-oxide layer 230 is disposed in the display area Ard and the first region Lab of the connection area Arc; and the second metal layer 255 is disposed in the second region Lc which is adjacent to the first region Lab of the connection area Arc. In this manner, the flexible transparent display sheet 200 having the integrally formed power connector may be provided, and the possibility of damage of the connection area Arc may be significantly reduced.

As the plurality of solders 233, formed on a portion of the anti-oxide layer 230, are electrically connected to the metal layer 220 through an opening of the anti-oxide layer 230, an electric signal may be applied to the light emitters 240 to enable the light emitters 240 to emit light.

The flexible transparent display sheet 200 further includes an adhesive layer 250 which is disposed on the periphery of the light emitters 240 and is formed on another portion of the anti-oxide layer 230. Accordingly, the plurality of light emitters 240 and the like, which are disposed on the flexible transparent display sheet 200, may be protected.

A width W1 of the adhesive layer 250 disposed between the light emitters 240 is greater than a width W2 of the adhesive layer 250 disposed on a border between the display area Ard and the connection area Arc. Accordingly, the plurality of light emitters 240 and the like, which are disposed on the flexible transparent display sheet 200, may be protected.

In addition, a height h6 of the adhesive layer 250 is greater than a sum h5 of a height of the solder 233 and a height of the light emitter 240. Accordingly, the plurality of light emitters 240 and the like, which are disposed on the flexible transparent display sheet 200, may be protected.

Further, a height h2 of the second metal layer 255 is smaller than a height h0 of the base 210 and is greater than a height h1 of the metal layer 220, thereby significantly reducing the possibility of damage of the second metal layer 255, and facilitating connection to an external connector.

It is desired that the width of the first region Lab of the connection area Arc is greater than the width of the second region Lc, thereby reducing the possibility of damage of the second metal layer 255 disposed in the second region Lc.

The light emitters 240 may include a micro light emitting diode (LED). Particularly, the plurality of light emitters may be spaced apart from each other in a grid pattern, such that a transparent display sheet may be achieved.

It is desired that the height h2 of the second metal layer 255 is smaller than the height h0 of the base 210 and is greater than the height h1 of the metal layer 220.

The base 210 may include at least one of Polyethylene terephthalate (PET), Polycarbonate (PC), PolyMethyl MethAcrylate (PMMA), Polyethylene, Polypropylene (PP), and Polyester.

The metal layer 220 may include copper (Cu) and the like, and the anti-oxide layer 230, formed on a portion of the metal layer 220, may include CUO.

Further, the second metal layer 255 may include plated copper and the like.

The adhesive layer 250 may include at least one of Polycarbonate (PC), PolyMethyl MethAcrylate (PMMA), Polyethylene terephthalate (PET), Polyethylene, Polypropylene (PP), and Polyester.

In addition, the adhesive layer 250 may include an adhesive, an additive, a hardener, a solvent, a dye, and a UV additive.

Figure 5:
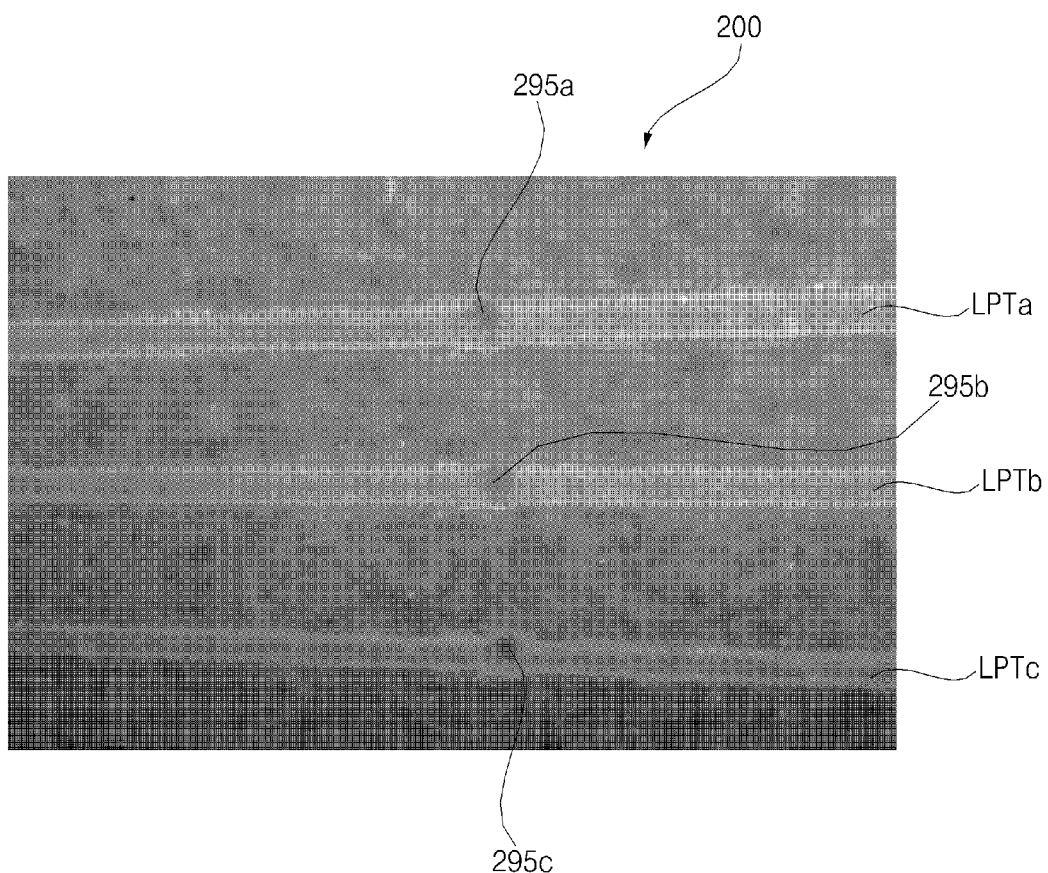
FIGS. 5 to 10 are diagrams referred to in explaining the flexible transparent display sheet of FIG. 3.

FIG. 5 illustrates an example where laser patterning is performed to manufacture the flexible transparent display sheet 200, in which patterning marks 295a, 295b, and 295c are formed in a plurality of lines LPTa, PPRb, and LPTc respectively.

Unlike the general flexible transparent display sheet, laser patterning may be performed on the flexible transparent display sheet 200 according to an embodiment of the present disclosure to form light emitters, thereby forming the patterning marks 295a, 295b, and 295c in the plurality of lines LPTa, PPRb, and LPTc respectively.

Figure 6A:
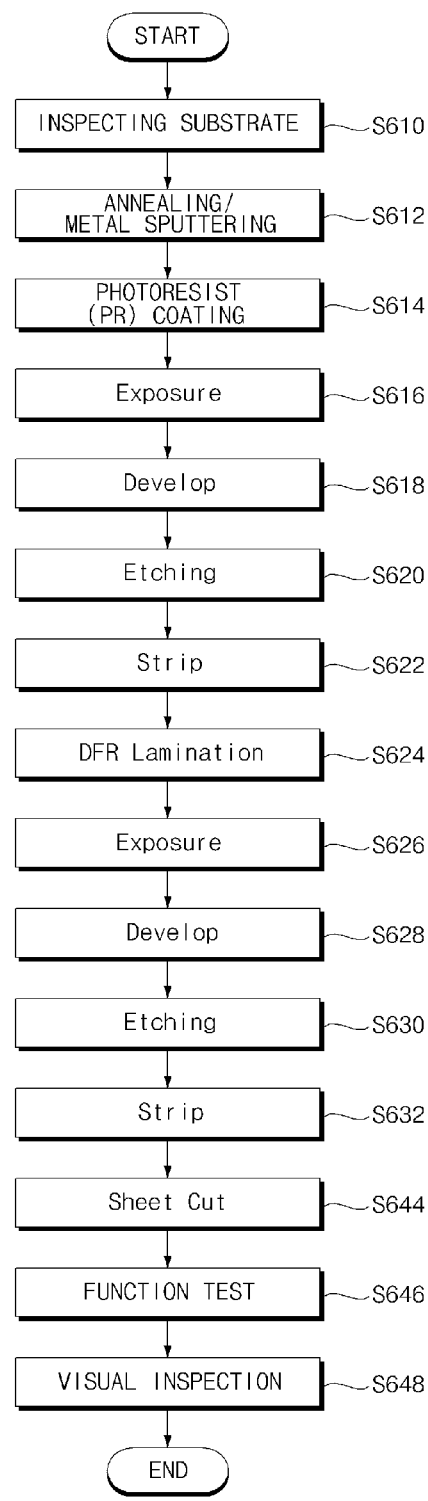

FIG. 6A is a flowchart illustrating a manufacturing process of the display area Ard of the general transparent display sheet 100.

Referring to FIG. 6A, inspection of a substrate is first performed in S610, and then annealing is performed to flatten a roll-shaped substrate, followed by metal (Cu) sputtering on the substrate in S612 and photoresist (PR) coating in S614.

Subsequently, exposure is performed in S616, followed by developing in S618, etching in S620, and stripping in S622, to form electric wiring.

Next, in order to form an anti-oxide layer, lamination is performed in S624, followed by exposure in S626, developing in 628, etching in 630, and stripping in S632, to form electric wiring.

Then, the display area Ard of the transparent display sheet 100 is cut in S644, followed by a function test in S646 and a visual inspection in S648, thereby completing manufacturing of the display area Ard of the transparent display sheet 100.

Figure 6B:
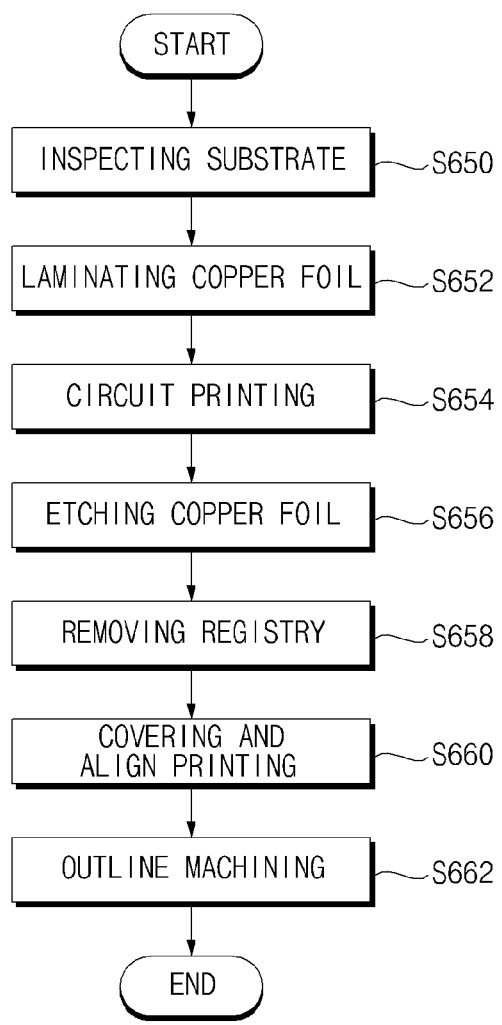

FIG. 6B is a flowchart illustrating a manufacturing process of the FPCB 160 of the general transparent display sheet 100.

Referring to FIG. 6B, inspection of a substrate is first performed in S650, followed by laminating of a copper foil in S652, and circuit printing in S654.

Then, etching of the copper foil in S656, removing of registry in S658, covering and align printing in S660, and outline machining in S662 are performed.

In this manner, the FPCB 160 of the general transparent display sheet 100 is manufactured.

Then, a bonding process is required for electric connection between the display area Ard of the general transparent display sheet 100 and the general FPCB 160.

That is, in the manufacturing process of the general transparent display sheet 100, the manufacturing process of the display area Ard and the manufacturing process of the FPCB 160 are performed separately, thereby requiring considerable manufacturing costs and time.

Figure 7:
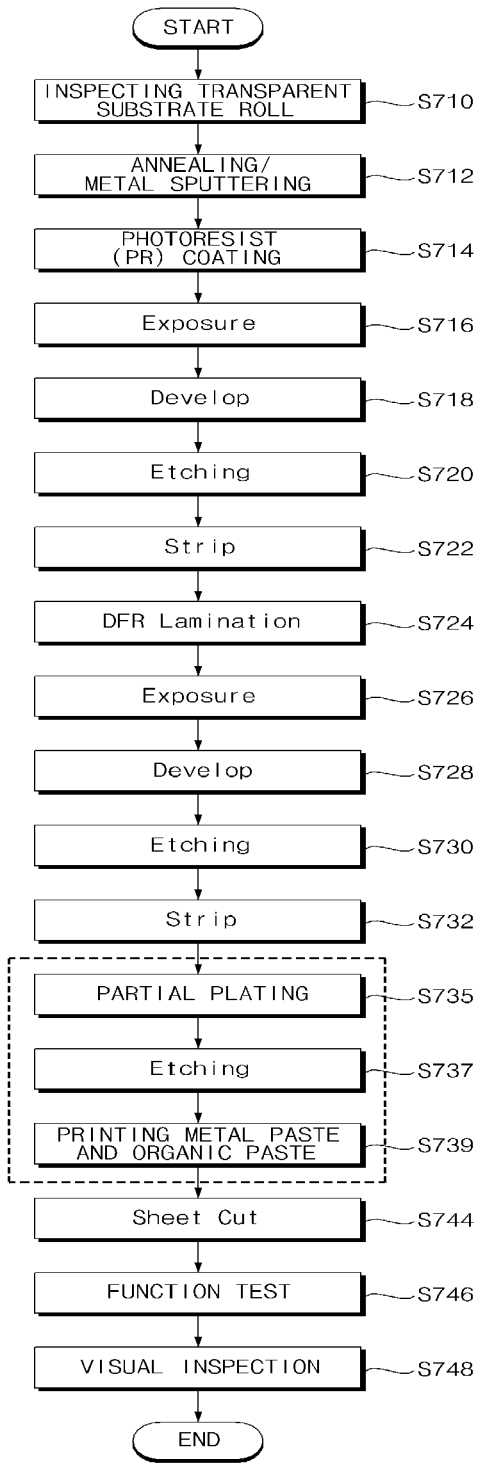

FIG. 7 is a flowchart illustrating an example of a manufacturing process of the transparent display sheet 200 according to an embodiment of the present disclosure.

Referring to FIG. 7, inspection of a substrate is first performed in S710, and then laser annealing is performed to flatten a roll-shaped substrate, followed by metal (Cu) sputtering on the substrate in S712 and photoresist (PR) coating in S714.

Then, exposure is performed in S716, followed by developing in 718, etching in 720, and stripping in S722, to form electric wiring.

Subsequently, in order to form an anti-oxide layer, lamination is performed in S724, followed by exposure in S726, developing in S728, etching in S730, and stripping in S732, to form electric wiring by opening of a solder.

Next, unlike the general transparent display sheet, partial plating is performed in S735, to form the second metal layer 235 in the connection area Arc.

Then, etching is performed in S737 in the first region Lab of the connection area Arc, and printing of an organic paste is performed in S739 in the etched first region Lab, to form the insulation layer 270 in the first region Lab.

In this manner, the second metal layer 235 is formed only in the second region Lc.

Subsequently, the display area Ard of the transparent display sheet 200, having an integrally formed power connector, is cut in S744, followed by a function test in S746 and a visual inspection in S748, thereby completing manufacturing of the transparent display sheet 200 having the integrally formed power connector.

As described above, compared to the general transparent display sheet, the manufacturing process of the transparent display sheet of the present disclosure may be simplified, such that manufacturing costs and time may be reduced.

Figure 8:
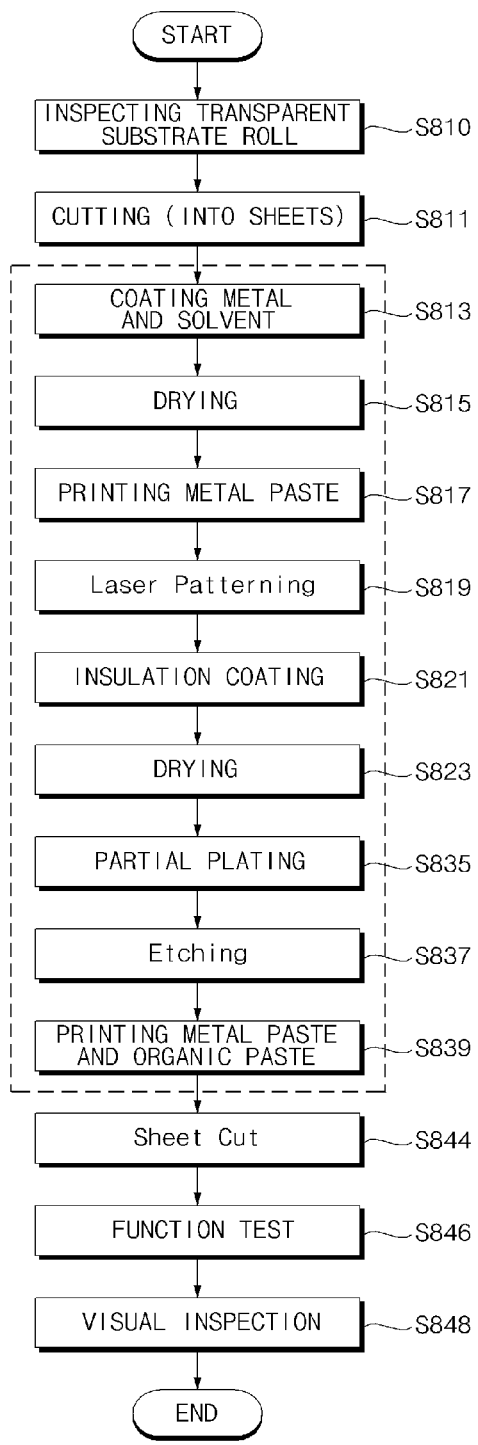

FIG. 8 is a flowchart illustrating another example of a manufacturing process of the transparent display sheet 200 according to an embodiment of the present disclosure.

Referring to FIG. 8, inspection of a substrate is first performed in S810, and then a roll-shaped substrate is cut immediately in S811.

Then, coating of the metal and solvent in S813, drying in S815, and metal paste printing in S817 are performed to form the metal layer 220.

Subsequently, laser patterning in S819 and insulation layer in S821 are performed to form an anti-oxide layer.

Next, drying in S823 and partial plating S835 are performed to form the second metal layer 235 in the connection area Arc.

Then, etching is performed in S837 in the first region Lab of the connection area Arc, and printing of an organic paste is performed in S839 in the etched first region, to form the insulation layer 270 in the first region Lab.

In this manner, the second metal layer 235 is formed only in the second region Lc.

Subsequently, the display area Ard of the transparent display sheet 200, having the integrally formed power connector, is cut in S844, followed by a function test in S846 and a visual inspection in S848, thereby completing manufacturing of the transparent display sheet 200 having the integrally formed power connector.

As described above, compared to the general transparent display sheet, the manufacturing process of the transparent display sheet of the present disclosure may be simplified, such that manufacturing costs and time may be reduced.

Figure 9:
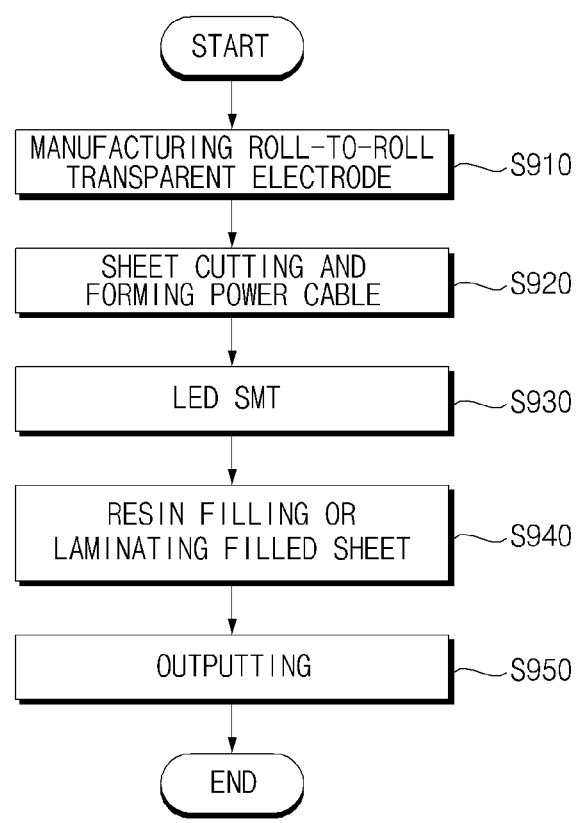

FIG. 9 is a diagram illustrating a manufacturing process of a light emitter according to an embodiment of the present disclosure.

Referring to FIG. 9, manufacturing of a transparent electrode is performed in S910, followed by sheet cutting and forming of a power cable in S920, mounting of an LED in S930, and resin filling or lamination in S940, and then outputting is performed in S950.

Figure 10:
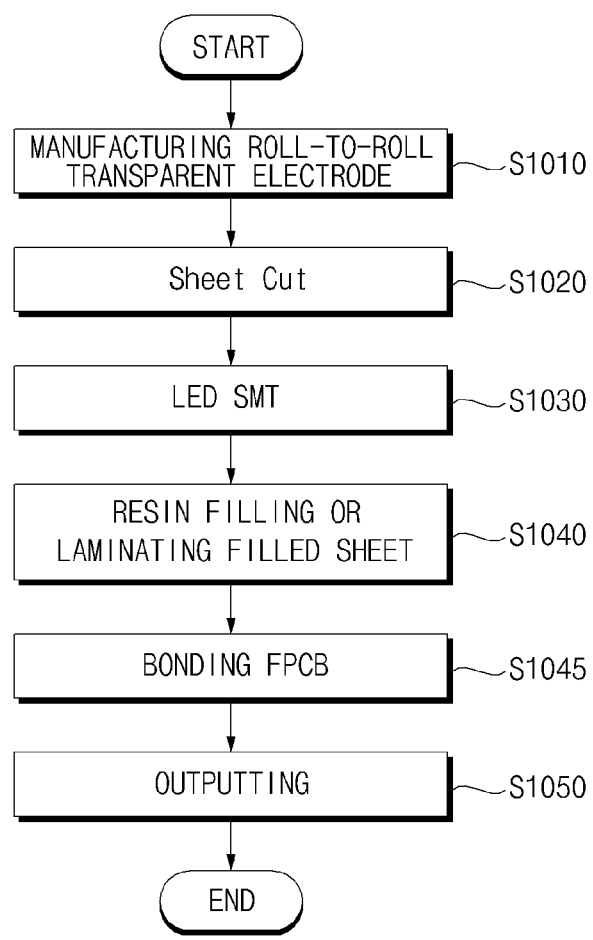

FIG. 10 is a diagram illustrating a manufacturing process of a general light emitter.

Referring to FIG. 10, manufacturing of a transparent electrode is performed in S1010, followed by sheet cutting and forming of a power cable in S1020, mounting of an LED in S1030, resin filling or lamination in S1040, and bonding of an FPCB in S1045, and then outputting is performed in S1050.

Upon comparison with FIG. 9, the manufacturing process of FIG. 10 is complicated as the bonding process of an FPCB is further required.

That is, according to an embodiment of the present disclosure, the bonding process of the FPCB may be omitted when manufacturing the transparent display sheet 200 having the integrally formed power connector, such that the possibility of damage of the power connector may be reduced.

The flexible transparent display sheet 200 according to the embodiments of the present disclosure described above with reference to FIGS. 3 to 10 may be adopted for various image display apparatuses.

For example, by using a plurality of flexible transparent display sheets 200, a stereoscopic image display apparatus may be achieved.

The flexible transparent display sheet 200 according to the embodiments of the present disclosure described above with reference to FIGS. 3 to 10 may be used in various applications such as TV, a monitor, a tablet PC, a mobile terminal (cellular phone, etc.), and the like.

Figure 11:
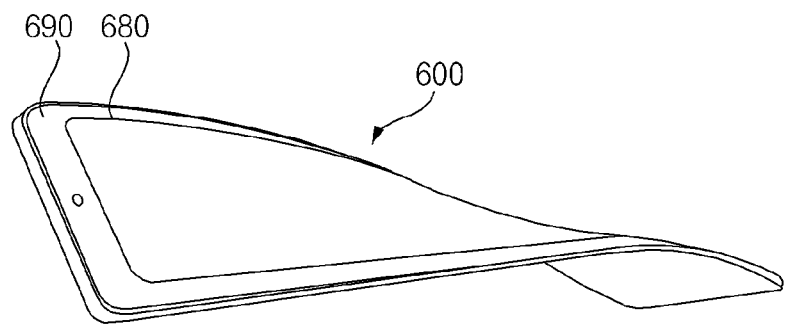
FIG. 11 is a diagram illustrating an outer appearance of an image display apparatus according to an embodiment of the present disclosure.

Among these applications, FIG. 11 illustrates an example where the flexible transparent display sheet 200 is applied to a mobile terminal to manufacture a flexible mobile terminal.

FIG. 11 is a diagram illustrating an outer appearance of an image display apparatus according to an embodiment of the present disclosure.

Referring to FIG. 11, the flexible image display apparatus 600 according to an embodiment of the present disclosure includes a flexible display 680 and a frame 690 enclosing the flexible display 680.

As described above, the flexible display 680 may include the flexible transparent display sheet 200.

Figure 12:
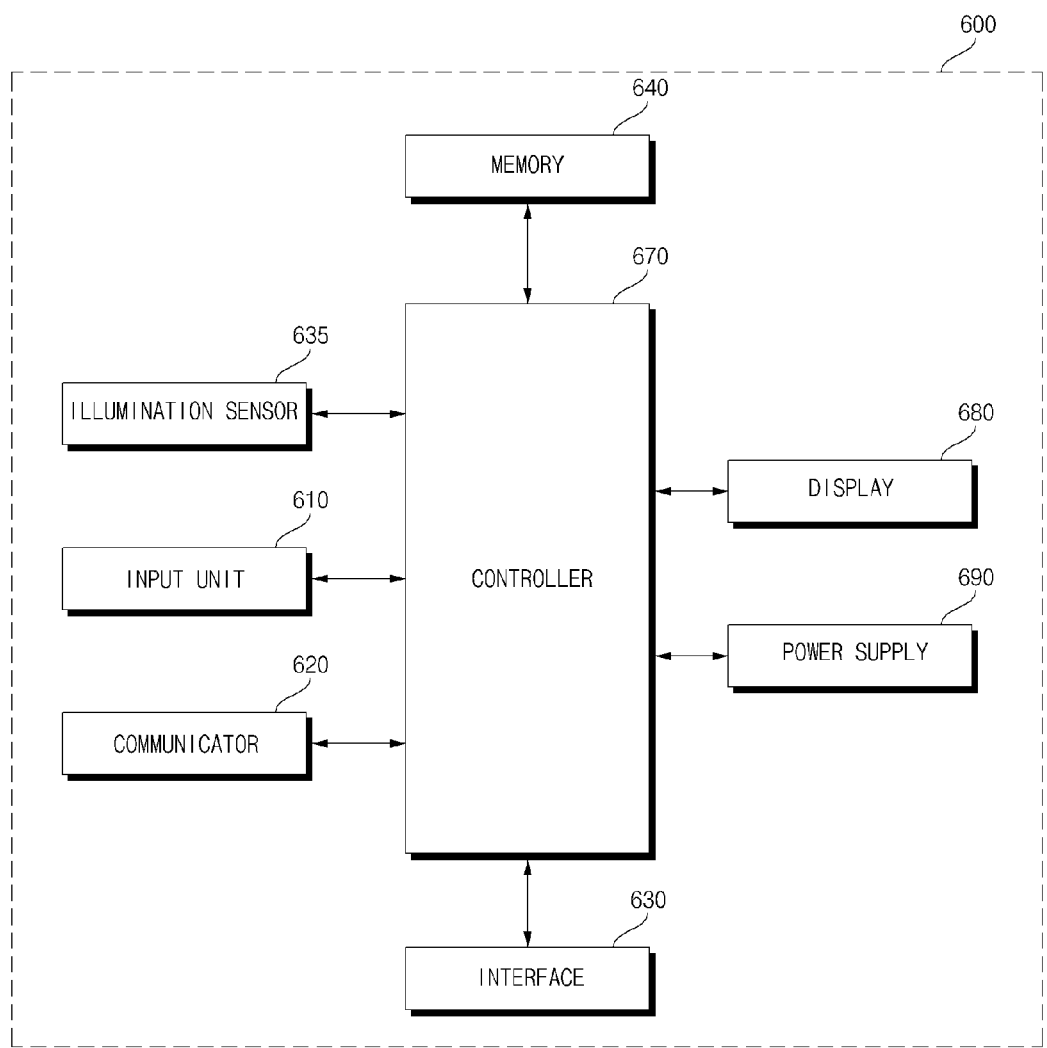
FIG. 12 is a block diagram illustrating an example of the image display apparatus of FIG. 11.

FIG. 12 is a block diagram illustrating an example of the image display apparatus of FIG. 11.

Referring to FIG. 12, the flexible image display apparatus 600 includes an input unit 610, a communicator 620, an interface 630, an illumination sensor 635, a memory 640, a controller 670, a display 680, and a power supply 690.

An input unit 610 may include a touch screen or a plurality of buttons which are attached to the flexible image display apparatus 600. The flexible image display apparatus 600 may be operated by turning on the plurality of buttons or the touch screen, and various other input operations may also be performed.

The communicator 620 may wirelessly exchange data with an external device, e.g., a mobile terminal (not shown) or a server (not shown).

The interface 630 may include a connector, and when a USB storage device is connected to a USB port and the like, data may be exchanged by wire.

The illumination sensor 635 may sense ambient illumination of the image display apparatus 600. The sensed illumination value may be transmitted to the controller 670.

The memory 640 may store various data, such as a program for processing or controlling the controller 670, and the like, which are used for the overall operation of the flexible image display apparatus 600.

The controller 670 may control the overall operation of each unit of the flexible image display apparatus 600.

Particularly, the controller 670 may control driving of a plurality of light emitting diodes.

Specifically, the controller 670 may divide the plurality of light emitting diodes into a plurality of blocks, and may apply different scan signals to each block, or may apply the same scan signal to the light emitting diodes in the same block.

In addition, the controller 670 may apply a sub-scan signal sequentially to each line of the light emitting diodes in the same block.

Further, based on the illumination value sensed by the illumination sensor 635, the controller 670 may vary the number of blocks of the plurality of light emitting diodes.

Particularly, as the ambient illumination increases, the controller 670 may control the number of blocks of the plurality of light emitting diodes to be reduced.

Moreover, based on the illumination value sensed by the illumination sensor 635, the controller 670 may vary the level of a scan signal applied to a scan switching device, or the level of a data signal applied to a data switching device.

Particularly, as the ambient illumination increases, the controller 670 may control the level of a scan signal applied to a scan switching device or the level of a data signal applied to a data switching device to be reduced.

The display 680 may include a driving circuit for driving a plurality of light emitting diodes (LEDs).

Under the control of the controller 670, the power supply 690 may supply power required for the operation of each component.

As is apparent from the above description, according to an embodiment of the present invention, there is provided a flexible transparent display sheet and an image display apparatus including the same, the flexible transparent display sheet including: a base disposed in the display area and the connection area; a metal layer formed on the base; an anti-oxide layer formed on a portion of the metal layer; a plurality of solders formed on a portion of the anti-oxide layer; a plurality of light emitters, each of which is connected to each of the plurality of solders; and an insulation layer disposed in the connection area and formed on the anti-oxide layer. Accordingly, a flexible transparent display sheet having an integrally formed power connector may be provided. In addition, a bonding process of a flexible printed circuit board (FPCB) may be omitted, and the possibility of damage of the connection area may be significantly reduced.

Moreover, the flexible transparent display sheet may further include a second metal layer disposed in the connection area and formed on the metal layer. Accordingly, a flexible transparent display sheet having an integrally formed power connector may be provided, and the possibility of damage of the connection area may be significantly reduced.

A height of the second metal layer may be equal to a sum of a height of the anti-oxide layer and a height of the insulation layer, thereby significantly reducing the possibility of damage of the second metal layer, and facilitating connection to an external connector.

The anti-oxide layer may be disposed in the display area and the first region of the connection area; and the second metal layer may be disposed in a second region adjacent to the first region of the connection area. Accordingly, a flexible transparent display sheet having an integrally formed power connector may be provided, and the possibility of damage of the connection area may be significantly reduced.

The plurality of solders, formed on a portion of the anti-oxide layer, may be electrically connected to the metal layer through an opening of the anti-oxide layer, such that an electric signal may be applied to the light emitters 240 to enable the light emitters 240 to emit light.

The flexible transparent display sheet may further include an adhesive layer disposed on the periphery of the light emitters, and formed on another portion of the anti-oxide layer. Accordingly, the plurality of light emitters and the like, which are disposed on the flexible transparent display sheet, may be protected.

A width of the adhesive layer, which is disposed between the light emitters, is greater than a width of the adhesive layer which is disposed on a border between the display area and the connection area. Accordingly, the plurality of light emitters and the like, which are disposed on the flexible transparent display sheet, may be protected.

A height of the adhesive layer may be greater than a sum of a height of the solder and a height of the light emitter. Accordingly, the plurality of light emitters and the like, which are disposed on the flexible transparent display sheet, may be protected.

A height of the second metal layer may be smaller than a height of the base and may be greater than a height of the metal layer, thereby significantly reducing the possibility of damage of the second metal layer, and facilitating connection to an external connector.

According to another embodiment of the present disclosure to achieve the above objects, there are provided a flexible transparent display sheet and an image display apparatus including the same, the flexible transparent display sheet including: a base disposed in the display area and the connection area; a metal layer formed on the base; an anti-oxide layer formed on a portion of the metal layer; a plurality of solders formed on a portion of the anti-oxide layer; a plurality of light emitters, each of which is connected to each of the plurality of solders; an insulation layer disposed in a first area of the connection area and formed on the anti-oxide layer; and a second metal layer, which is disposed in a second area adjacent to the first area of the connection area, and is formed on the metal layer. Accordingly, a flexible transparent display sheet having an integrally formed power connector may be provided. In addition, a bonding process of a flexible printed circuit board (FPCB) may be omitted, and the possibility of damage of the connection area may be significantly reduced.

The flexible transparent display sheet and the image display apparatus including the same are not limited to the configuration and method of the embodiments described above, and all or some of the above embodiments may be selectively combined with each other to enable various modifications thereof.

While the present disclosure has been shown and described with reference to the preferred embodiments thereof, it should be understood that the present disclosure is not limited to the specific embodiments, and various modifications and variations may be made by those skilled in the art without departing from the scope and spirit of the invention as defined by the appended claims, and the modified implementations should not be construed independently of the technical idea or prospect of the present disclosure.

What is claimed is:

1. A flexible transparent display sheet having a display area and a connection area, the flexible transparent display sheet comprising:
   a base disposed in the display area and the connection area;
   a metal layer formed on the base;
   an anti-oxide layer formed on a portion of the metal layer;
   a plurality of solders formed on a portion of the anti-oxide layer;
   a plurality of light emitters, each of which is connected to each of the plurality of solders; and
   an insulation layer disposed in the connection area and formed on the anti-oxide layer.

2. The flexible transparent display sheet of claim 1, wherein:
   the anti-oxide layer is disposed in the display area and a first region of the connection area; and
   the insulation layer is disposed in the first region of the connection area.

3. The flexible transparent display sheet of claim 1, further comprising a second metal layer disposed in the connection area and formed on the metal layer.

4. The flexible transparent display sheet of claim 3, wherein a height of the second metal layer is equal to a sum of a height of the anti-oxide layer and a height of the insulation layer.

5. The flexible transparent display sheet of claim 3, wherein:
the anti-oxide layer is disposed in the display area and the first region of the connection area; and
the second metal layer is disposed in a second region adjacent to the first region of the connection area.

6. The flexible transparent display sheet of claim 5, wherein a width of the first region is greater than a width of the second region.

7. The flexible transparent display sheet of claim 1, wherein the plurality of solders, formed on a portion of the anti-oxide layer, are electrically connected to the metal layer through an opening of the anti-oxide layer.

8. The flexible transparent display sheet of claim 1, further comprising an adhesive layer disposed on the periphery of the light emitters, and formed on another portion of the anti-oxide layer.

9. The flexible transparent display sheet of claim 8, wherein a width of the adhesive layer, which is disposed between the light emitters, is greater than a width of the adhesive layer disposed on a border between the display area and the connection area.

10. The flexible transparent display sheet of claim 8, wherein a height of the adhesive layer is greater than a sum of a height of the solder and a height of the light emitter.

11. The flexible transparent display sheet of claim 3, wherein a height of the second metal layer is smaller than a height of the base and is greater than a height of the metal layer.

12. The flexible transparent display sheet of claim 1, wherein the light emitters comprise a micro light emitting diode (LED).

13. A flexible transparent display sheet having a display area and a connection area, the flexible transparent display sheet comprising:
a base disposed in the display area and the connection area;
a metal layer formed on the base;
an anti-oxide layer formed on a portion of the metal layer;
a plurality of solders formed on a portion of the anti-oxide layer;
a plurality of light emitters, each of which is connected to each of the plurality of solders;
an insulation layer disposed in a first area of the connection area and formed on the anti-oxide layer; and
a second metal layer, which is disposed in a second area adjacent to the first area of the connection area, and is formed on the metal layer.

14. The flexible transparent display sheet of claim 13, wherein a height of the second metal layer is equal to a sum of a height of the anti-oxide layer and a height of the insulation layer.

15. An image display apparatus, comprising:
a display; and
a controller configured to control the display,
wherein the display comprises a flexible transparent display sheet having a display area and a connection area,
wherein the flexible transparent display sheet comprises:
a base disposed in the display area and the connection area;
a metal layer formed on the base;
an anti-oxide layer formed on a portion of the metal layer;
a plurality of solders formed on a portion of the anti-oxide layer;
a plurality of light emitters, each of which is connected to each of the plurality of solders; and
an insulation layer disposed in the connection area and formed on the anti-oxide layer.

16. The image display apparatus of claim 15, wherein:
the anti-oxide layer is disposed in the display area and a first region of the connection area; and
the insulation layer is disposed in the first region of the connection area.

17. The image display apparatus of claim 15, further comprising a second metal layer disposed in the connection area and formed on the metal layer.

18. The image display apparatus of claim 17, wherein a height of the second metal layer is equal to a sum of a height of the anti-oxide layer and a height of the insulation layer.

19. The image display apparatus of claim 17, further comprising an adhesive layer disposed on the periphery of the light emitters, and formed on another portion of the anti-oxide layer.

20. The image display apparatus of claim 19, wherein a width of the adhesive layer, which is disposed between the light emitters, is greater than a width of the adhesive layer disposed on a border between the display area and the connection area.

* * * * *